United States Patent
Sigmon et al.

[11] Patent Number: 5,990,735
[45] Date of Patent: Nov. 23, 1999

[54] METHOD AND APPARATUS FOR HIGH EFFICIENCY POWER AMPLIFICATION

[75] Inventors: Bernard Eugene Sigmon, Gilbert; Ronald Gene Myers, Scottsdale, both of Ariz.

[73] Assignee: Motorola, Inc., Schaumburg, Ill.

[21] Appl. No.: 09/053,224

[22] Filed: Apr. 1, 1998

Related U.S. Application Data

[63] Continuation-in-part of application No. 08/887,063, Jul. 2, 1997, Pat. No. 5,861,777.

[51] Int. Cl.$^6$ .................................................. H03F 3/38
[52] U.S. Cl. ..................................... 330/10; 330/207 A
[58] Field of Search ................................ 330/10, 207 A, 330/251, 124 R, 136

[56] References Cited

U.S. PATENT DOCUMENTS

| | | | |
|---|---|---|---|
| 3,777,275 | 12/1973 | Cox | 330/10 |
| 4,831,334 | 5/1989 | Hudspeth et al. | 330/10 |
| 5,218,315 | 6/1993 | Turner | 330/10 |
| 5,251,330 | 10/1993 | Chiba et al. | 455/91 |
| 5,306,986 | 4/1994 | Siao | 315/248 |
| 5,831,475 | 11/1998 | Myers et al. | 339/10 |
| 5,847,602 | 12/1998 | Su | 330/10 |
| 5,861,777 | 1/1999 | Sigmon et al. | 330/136 |

OTHER PUBLICATIONS

A publication entitled, "High–Efficiency Single–Sideband HF/VHF Transmitter Based Upon Envelope Elimination and Restoration", F.H. Raab and D.J. Rupp, Green Mountain Radio Research Company, USA, 5 pages.

A publication entitled, "Class–S High Efficiency Amplitude Modulator", Frederick H. Raab, Ph.D. and Daniel J. Rupp, Green Mountain Radio Research Company, USA, May 1994, 5 pages.

A publication entitled, "Single–Sideband Transmission by Envelope Elimination and Restoration", Leonard R. Kahn, 4 pages.

*Primary Examiner*—Robert Pascal
*Assistant Examiner*—Henry Choe
*Attorney, Agent, or Firm*—Dana B. LeMoine; Frank J. Bogacz

[57] ABSTRACT

A method and apparatus for efficient power amplification of a wideband signal with a correspondingly wide modulation bandwidth includes an envelope detector (220), an multi-stage class S modulator (270), and a power amplifier (260). The multi-stage class S modulator (270) includes multiple stages (480), where each stage includes a pair of switching transistors (430, 440) and a capacitor (450). The capacitor (450) supplies the inrush current requirements of the stage (480) so that filtering at the switching frequency is substantially provided within the stage (480). Multiple stages (480) are included on a single semiconductor substrate resulting in higher switching frequencies, higher modulation bandwidths, and lower external filtering requirements.

20 Claims, 4 Drawing Sheets

5,990,735

METHOD AND APPARATUS FOR HIGH EFFICIENCY POWER AMPLIFICATION

This application is a continuation-in-part of patent application Ser. No. 08/887,063 filed on Jul. 2, 1997, which issued as U.S. Pat. No. 5,861,777 on Jan. 19, 1999, entitled "Method and Apparatus for Compensation of Phase Distortion in Power Amplifiers."

FIELD OF THE INVENTION

This invention relates in general to power amplifiers and, in particular, to high efficiency, wideband power amplifiers.

BACKGROUND OF THE INVENTION

Various apparatus are available for amplifying signals. In amplifier applications that involve the amplification and transmission of modulated signals, a premium is placed on amplifier efficiency. In addition, because many applications require a wide bandwidth, a premium is placed on the ability to efficiently create a high fidelity reproduction of a wideband signal.

Communications devices, which often transmit wideband signals, are an example of an application where these qualities are in demand. Low distortion allows the communications devices to communicate more reliably, and high efficiency allows the devices to operate longer on a single battery.

Wideband communications signals usually have correspondingly wide modulation bandwidths. That is, when a signal occupies a large RF bandwidth, the envelope of the signal within that bandwidth is rapidly changing. An amplifier that efficiently amplifies a signal of this type preferably has a wide RF bandwidth and a wide modulation bandwidth.

One method of achieving increased efficiency is to use envelope elimination and restoration (EER)-type amplifiers. EER is a technique through which highly efficient but nonlinear radio frequency (RF) power amplifiers can be combined with other, highly efficient amplifiers to produce a high efficiency linear amplifier system. The signal to be amplified is split into two paths: an amplitude path, and a phase path. The detected envelope is amplified efficiently in the amplitude path by a class S or other highly efficient power amplifier which operates on the bandwidth of the RF envelope rather than the RF bandwidth. The phase modulated carrier in the phase path is then amplitude modulated by the amplified envelope signal, creating an amplified replica of the input signal.

In EER-type amplifiers the envelope signal occupying the modulation bandwidth is amplified in the amplitude path. Conventional EER-type amplifiers utilize class S modulators to amplify the modulation bandwidth included in the envelope of the input signal. Unfortunately, class S modulators are limited in bandwidth by the switching frequency at which they operate, and as the switching frequency increases, the class S modulator becomes less efficient. This practical constraint sets a maximum modulation bandwidth achievable for any given amplifier efficiency.

Accordingly, a need exists for a power amplifier that efficiently amplifies a wide band RF signal exhibiting a wide modulation bandwidth.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE DRAWINGS

Generally, the present invention helps solve the above-identified problems by providing an amplifier that efficiently amplifies wideband signals with correspondingly wide modulation bandwidths.

Figure 1:
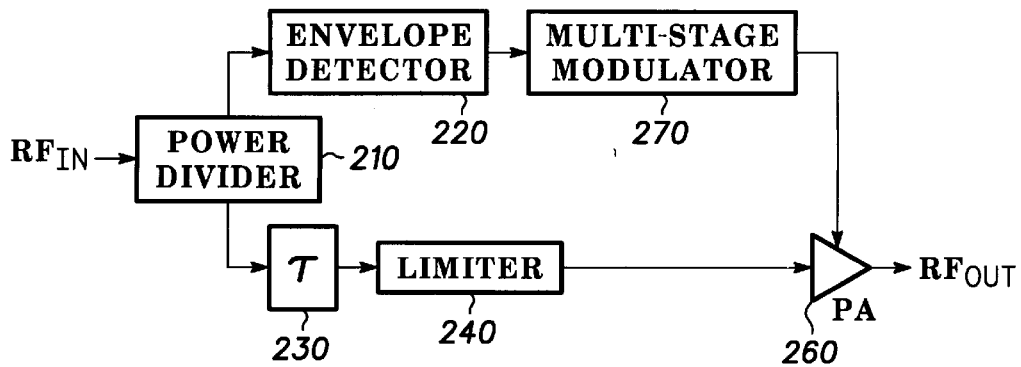
FIG. 1 shows a diagram of an amplifier in accordance with a preferred embodiment of the present invention.

FIG. 1 shows a diagram of an amplifier in accordance with a preferred embodiment of the present invention. EER-type amplifier 10 includes power divider 210, envelope detector 220, multi-stage class S modulator 270, time delay element 230, limiter 240, and power amplifier 260. EER-type amplifier 10 receives an RF input into power divider 210. Power divider 210 splits the RF input signal into an amplitude path which feeds envelope detector 220, and a phase path which feeds time delay element 230.

The phase path of EER-type amplifier 10 includes time delay element 230, limiter 240 and power amplifier 260. Time delay element 230, which produces a delay substantially equal to that introduced by multi-stage class S modulator 270 in the amplitude path, receives an output from power divider 210. Limiter 240 receives the time delayed signal output from time delay element 230, and amplitude limits the signal. Limiter 240 can be omitted, or it can perform soft limiting, but limiter 240 preferably performs hard limiting so that the output of limiter 240 includes phase information with little or no amplitude information. After limiting, with the amplitude information removed, the resultant signal is the phase modulated carrier. The phase modulated carrier output from limiter 240 is input to power amplifier 260. Power amplifier 260 is any amplifier stage capable of being modulated, and it is preferably a field effect transistor (FET) amplifier. The drain of the FET is conventionally connected to a DC power source; however, as will be discussed below, in a preferred embodiment exemplified herein, the drain of the FET is driven with a signal, resulting in an amplitude modulated output signal.

In a preferred embodiment, time delay element 230 is used in the phase path because it is desirable to recombine the signals from the amplitude path and the phase path after each has been subjected to substantially equal delays. The absolute delay of time delay element 230 is such that the total delay in the phase path is substantially equal to the total delay in the amplitude path. Time delay element 230 is shown as the first element in the phase path; however, the actual placement of time delay element 230 within the phase path is not a limitation of the present invention. Because the function of time delay element 230 is to balance the delays in the phase path and the amplitude path, the actual position of time delay element 230 in the phase path is not important. In an alternate embodiment of the present invention the delay in multi-stage class S modulator 270 is minimized by appropriate control such that time delay element 230 becomes unnecessary and is omitted.

Alternate embodiments of the present invention substantially match the delay in the two paths using circuit arrangements other than the one using time delay element 230 alone. In a first alternate embodiment, multiple delay lines, one in each of the phase path and amplitude path are used. In this case, the absolute delay of any one delay line assumes less importance, and the differential delay between the two delay lines is used to match the delays in the two paths. In another alternate embodiment, a differential delay line, such as a surface acoustic wave (SAW) delay line, with one input and multiple outputs is used as a combination of power divider 210 and time delay element 230. In this alternate embodiment, as in the first alternate embodiment, the differential delay is used to match the delay in the two paths.

The amplitude path of EER-type amplifier 10 includes envelope detector 220 and multi-stage class S modulator 270. Envelope detector 220 detects the envelope of the RF input signal and outputs an envelope signal which represents the amplitude information included in the original RF input signal. Envelope detector 220 is preferably a diode detector; however, other types of detectors, such as a synchronous detector based upon a double balanced mixer, could be used. Additionally, in an alternate embodiment, the envelope signal is computed from baseband inphase (I) and quadrature (Q) signals.

Multi-stage class S modulator 270 amplifies the envelope signal output from envelope detector 220 and drives the drain bias of power amplifier 260. Multi-stage class S modulator 270 amplifies the envelope signal to a level commensurate with the desired output. The output of multi-stage class S modulator 270 is the power supply for power amplifier 260, and the resultant remodulation of the phase modulated carrier restores the envelope, producing an amplified replica of the input signal.

The EER-type amplifier of FIG. 1 varies the drain bias of power amplifier 260 in such a way as to maintain operation near saturation and therefore in a region of high efficiency. Because the highly efficient power amplifier 260 consumes the majority of the power consumed in EER-type amplifier 10, the entire circuit is considerably more efficient than conventional amplifiers.

Figure 2:
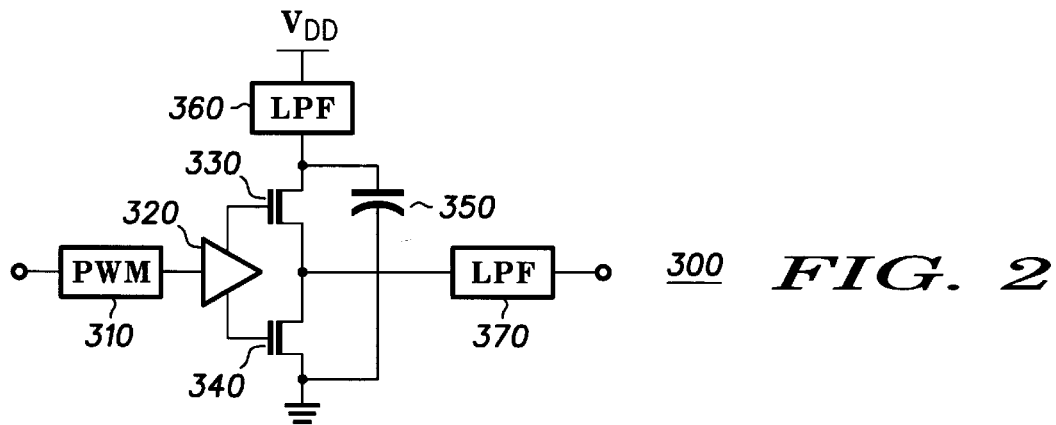
FIG. 2 shows a diagram of a class S modulator in accordance with a embodiment of the present invention.

FIG. 2 shows a diagram of a class S modulator in accordance with an embodiment of the present invention. Class S modulator 300 is a single stage class S modulator as evidenced by the single pair of switching transistors, 330 and 340. The operation of the single stage class S modulator 300 is described with reference to FIG. 2 before describing the operation of the more general multi-stage class S modulator with reference to FIG. 3. Class S modulator 300 includes pulsewidth modulator (PWM) 310, a driver 320, high side switch 330, low side switch 340, capacitor 350, and lowpass filters 360 and 370. PWM 310 receives the envelope signal from envelope detector 220(FIG. 1). PWM 310 pulsewidth modulates the envelope signal so that driver 320 is driven with a pulse train having a duty cycle substantially proportional to the amplitude of the envelope of the original RF input signal. Driver 320 alternately drives switches 330 and 340 such that when the pulsewidth modulated signal is high, switch 330 is on and switch 340 is off, and when the pulsewidth modulated signal is low, switch 330 is off and switch 340 is on. The switching action of switches 330 and 340 creates an amplified pulsewidth modulated signal at the input to lowpass filter 370, where the signal switches between Vdd and ground. Lowpass filter 370 smoothes the signal so that the resulting output signal is an amplified replica of the envelope signal input to PWM 310.

In a preferred embodiment, high side switch 330 and low side switch 340 are implemented with field effect transistors (FETs). One skilled in the art will appreciate that there are other ways to implement switches for the purposes of the present invention.

The switching frequency of PWM 310 is preferably maintained at a frequency higher than the bandwidth of the envelope signal, and in a preferred embodiment, the switching frequency is at least ten times the bandwidth of the envelope signal. In this preferred embodiment, when switch 330 is on, an inrush current is provided from Vdd, lowpass filter 360, and capacitor 350 to charge the input of lowpass filter 370 to a voltage value substantially equal to Vdd. In typical class S modulator implementations, capacitor 350 does not exist and significant transient current requirements are placed on lowpass filter 360. Without capacitor 350 to support the inrush current, low pass filter 360, sometimes referred to in the art as a decoupling network, filters the current transients so that the power supply, Vdd, sustains a minimal impact.

In a preferred embodiment of the present invention, capacitor 350 is large enough to supply the entire inrush current needs of class S modulator 300. Also in a preferred embodiment, class S modulator 300 is implemented on a single semiconductor substrate. Implementation on a single substrate allows the switching frequency to increase and as desirable result, allows the bandwidth to increase. Unfortunately, if capacitor 350 is large enough to handle the inrush current requirements of class S modulator 300, it is too large to be implemented on a semiconductor die, and some advantages are lost. The circuit of FIG. 3 addresses this problem.

Figure 3:
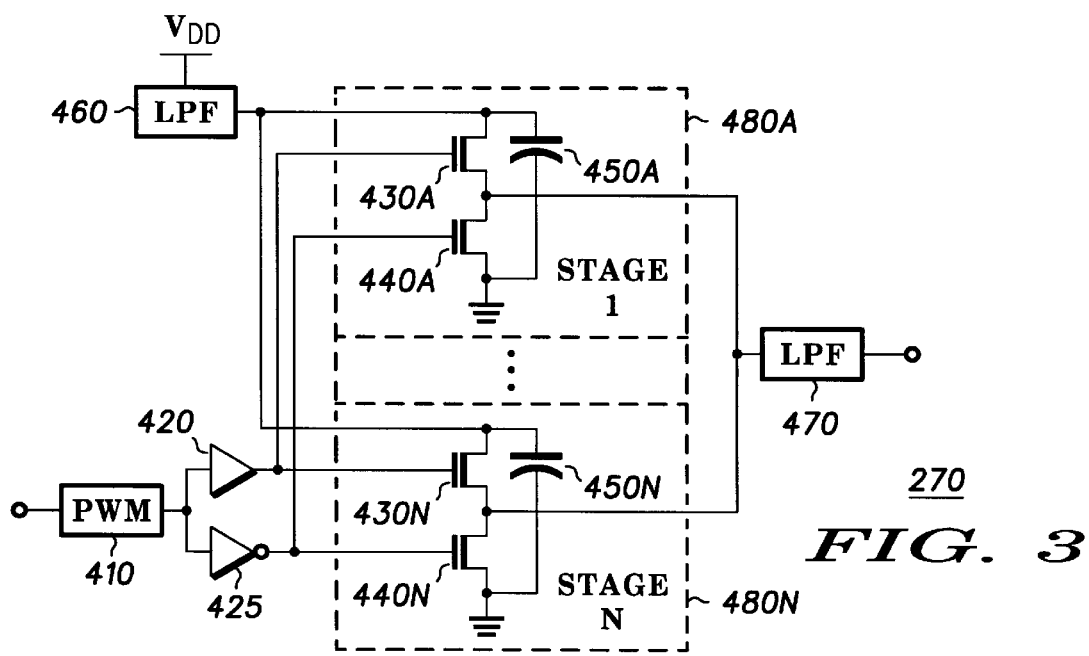
FIG. 3 shows a diagram of a multi-stage class S modulator in accordance with a preferred embodiment of the present invention.

FIG. 3 shows a diagram of a multi-stage class S modulator in accordance with a preferred embodiment of the present invention. Multi-stage class S modulator 270 includes PWM 410, drivers 420 and 425, stages 480A through 480N, and lowpass filters 460 and 470. Each stage includes high side switch 430, low side switch 440, and capacitor 450. FIG. 3 explicitly shows two stages, 480A and 480N, but N represents any integer, and any number of stages can exist between the first stage and the Nth stage.

In a preferred embodiment, each stage is small enough so that capacitor 450, when implemented on a silicon substrate, can satisfy the inrush current requirements of the stage. Because each capacitor 450 satisfies the inrush current requirements of its stage, all stages in parallel have their inrush current requirements met. As a result, the parallel stages can be integrated onto a single piece of silicon, including capacitors 450A through 450N. Because the inrush current requirements are met by capacitors 450A through 450N, lowpass filter 460 does not have to supply the potentially large inrush current to all of the stages. As a result, low pass filter only has to filter at the bandwidth of the envelope signal rather than at the substantially higher switching frequency.

A significant advantage provided by the method and apparatus of the present invention is integration. The majority of multi-stage class S modulator 270 can be implemented on a single, monolithic, semiconductor substrate such as complementary gallium arsenide (C-GaAs), CMOS, BiCMOS, or LDMOS. For example, in a preferred embodiment, PWM 410, drivers 420 and 425, and stages 480A through 480N are implemented on a single substrate. In another embodiment, just stages 480A through 480N are included on a single substrate. This results in space savings, power savings, and potentially much higher modulation bandwidths.

Figure 4:
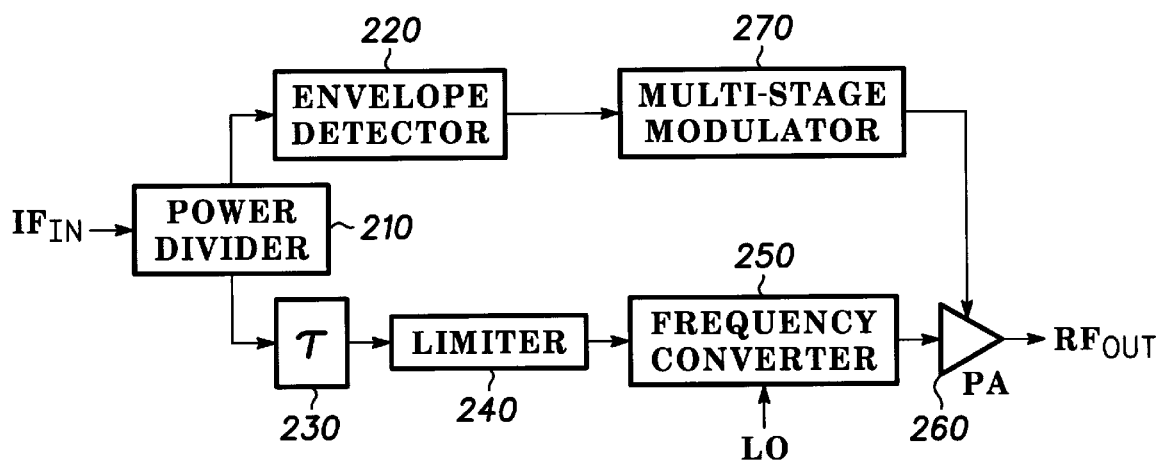
FIG. 4 shows a diagram of an amplifier in accordance with an alternate embodiment of the present invention.

FIG. 4 shows a diagram of an amplifier in accordance with an alternate embodiment of the present invention. In FIG. 4 an intermediate frequency (IF) signal is shown as the input signal to EER-type amplifier 20. The IF signal is input into power divider 210. Power divider 210 functions to split the input signal into the amplitude path and the phase path. The amplitude path feeds envelope detector 220, and the phase path feeds time delay element 230.

The amplitude path of EER-type amplifier 20 includes envelope detector 220 and multi-stage class S modulator 270. These elements correspond to the elements of FIG. 1 which have like names and like reference numbers. In addition, multi-stage class S modulator 270 corresponds to multi-stage class S modulator 270 of FIG. 1, which was discussed in detail previously in connection with FIG. 2.

The phase path of EER-type amplifier 20 includes time delay element 230, limiter 240, frequency converter 250 and power amplifier 260. Time delay element 230, limiter 240 and power amplifier 260 correspond to the elements shown in FIG. 1 with like names and like reference numbers. In contrast to the embodiment shown in FIG. 1, the alternate embodiment of FIG. 4 includes frequency converter 250 in the phase path. Frequency converter 250 receives the signal in the phase path and also receives a local oscillator (LO) signal. Frequency converter 250 converts the frequency of the carrier signal to its final RF frequency using circuitry well known in the art, such as a mixer. The resulting signal is then used to drive power amplifier 260 which operates at the final RF frequency.

Because of the operation of frequency converter 250, the amplifier of FIG. 4 takes in a signal at a frequency different from the final RF frequency. FIG. 4 shows an IF signal input to EER-type amplifier 20. The IF input signal can be above or below the resultant RF frequency. In addition, one skilled in the art will understand that a baseband signal could also be used. Therefore, in the alternate embodiment exemplified in FIG. 4, the input signal can be at any frequency different from the RF frequency.

In this circuit arrangement, with frequency converter 250 being an integral part of the amplifier, the amplifier becomes more tightly integrated with the device that houses the amplifier. Tighter integration results in smaller, lower power devices, which are easier to manufacture.

Figure 5:
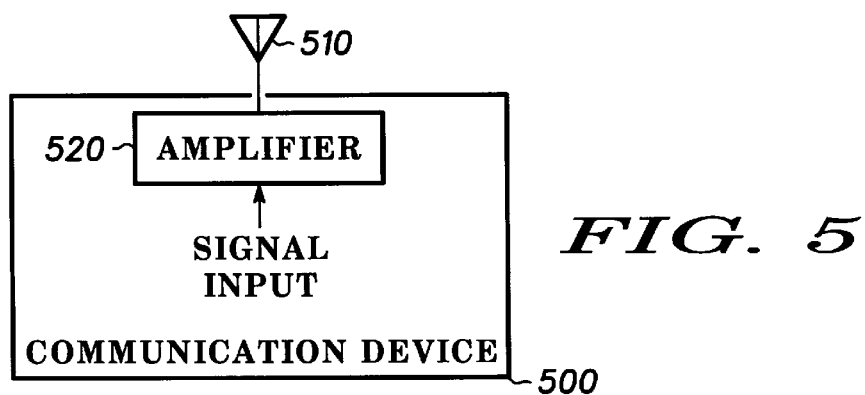
FIG. 5 shows a diagram of a communications device in accordance with a preferred embodiment of the present invention.

FIG. 5 shows a diagram of a communications device in accordance with a preferred embodiment of the present invention. Communications device 500 includes amplifier 520 and antenna 510. Amplifier 520 may comprise any of the amplifiers of the present invention, including for example, EER-type amplifier 10 (FIG. 1), multi-stage class S modulator 270 (FIG. 3), or EER-type amplifier 20 (FIG. 4). Communications device 500 may be one of many different devices capable of communications. Examples include, but are not limited to, subscriber units in a communications system, radio receivers, transmitters, and transceivers, one-way and two-way pagers, cellular phones, other radiotelephones, and basestations.

Figure 6:
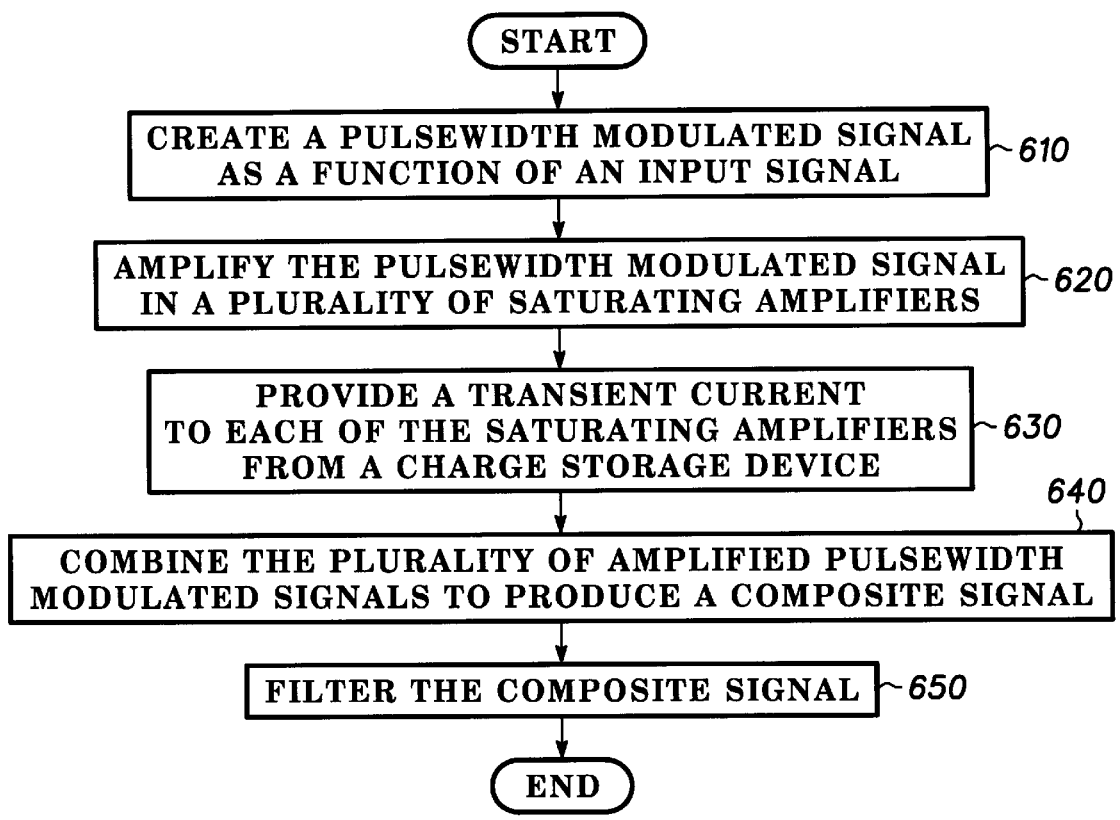
FIG. 6 shows a flowchart for a method of amplifying a signal in accordance with a preferred embodiment of the present invention.

FIG. 6 shows a flowchart for a method of amplifying a signal in accordance with a preferred embodiment of the present invention. Method 600 begins with step 610 where a pulsewidth modulated signal is created as a function of an input signal. The pulsewidth modulated signal has a duty cycle substantially proportional to the amplitude of the input signal.

Then in step 620, the pulsewidth modulated signal is amplified in a plurality of saturating amplifiers. The saturating amplifiers are preferably implemented with switching transistors, such as in the exemplary embodiment shown in FIG. 3. When the saturating amplifiers are switching, a transient current exists. In step 630, a transient current is provided from a storage device to the saturating amplifiers. The storage device can be a single capacitor such as capacitor 350(FIG. 2) or can be multiple capacitors, one for each amplifier, such as capacitor 450(FIG. 3).

After the input signal is amplified in a plurality of amplifiers, the outputs of the amplifiers are combined in step 640. The outputs of the amplifiers are amplified pulsewidth modulated signals. After the combining of step 640, a composite signal exists. Finally in step 650, the composite signal is filtered to produce an amplified version of the input signal.

Figure 7:
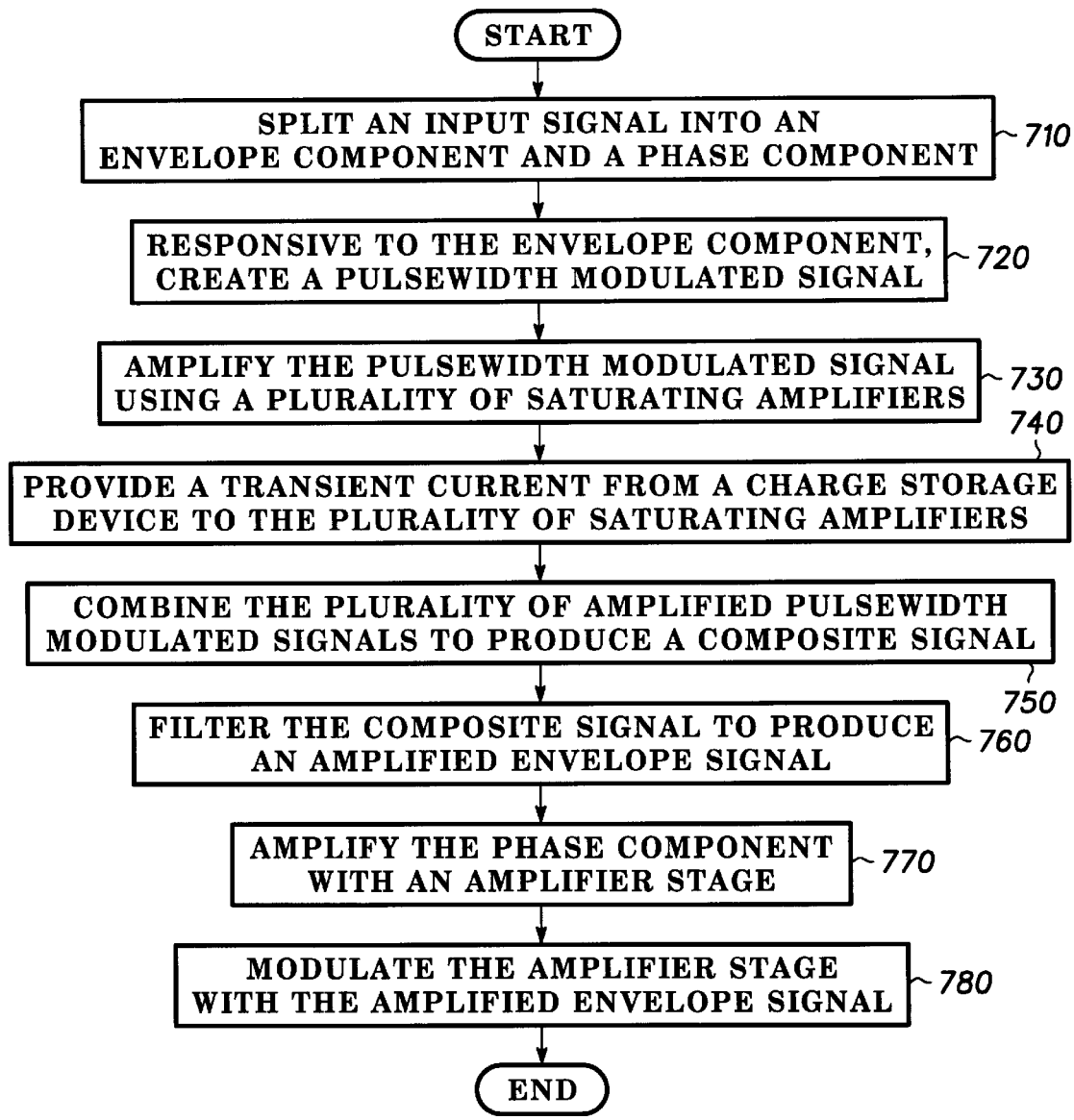
FIG. 7 shows a flowchart for a method of amplifying a signal in accordance with a preferred embodiment of the present invention.

FIG. 7 shows a flowchart for a method of amplifying a signal in accordance with a preferred embodiment of the present invention. Method 700 begins with step 710 where an input signal is split into an envelope component and a phase component. The envelope component is pulsewidth modulated to produce a pulsewidth modulated signal in step 720. The pulsewidth modulated signal has a duty cycle substantially proportional to the amplitude of the envelope component.

Then in step 730, the pulsewidth modulated signal is amplified in a plurality of saturating amplifiers. The saturating amplifiers are preferably implemented with switching transistors, such as in the exemplary embodiment shown in FIG. 3. When the saturating amplifiers are switching, a transient current exists. In step 740, a transient current is provided from a storage device to the saturating amplifiers. The storage device can be a single capacitor such as capacitor 350(FIG. 2) or can be multiple capacitors, one for each amplifier, such as capacitor 450(FIG. 3).

After the envelope component is amplified in a plurality of amplifiers, the outputs of the amplifiers are combined in step 750. The outputs of the amplifiers are amplified pulsewidth modulated signals. After the combining of step 750, a composite signal exists. Then in step 760, the composite signal is filtered to produce an amplified envelope signal.

In step 770 the phase component is amplified with a power amplifier. Finally, in step 780, the signals in the amplitude path and the phase path are brought back together when the power amplifier is modulated with the amplified envelope signal. This modulation can be performed in a number of ways, but in a preferred embodiment, it is performed by modulating the drain bias of a field effect transistor (FET) amplifier. In this way, the amplified envelope signal functions as the power supply of the final RF amplifier. The result is a high fidelity RF output signal which is an amplified and optionally frequency converted version of the input signal.

It is desirable to recombine the amplitude of the signal with the phase of the signal after each has undergone a similar delay. Depending on the circuit elements used in amplifying the envelope signal and in amplifying the phase component, a time delay may be necessary in one or more signal paths in order to time align the recombination of the amplitude and phase.

In summary, the method and apparatus of the present invention as described is a versatile way of achieving efficient amplification of a signal with a large RF bandwidth and a correspondingly large modulation bandwidth. Embodiments of an EER-type amplifier which utilizes a multi-stage class S modulator have been described. The multi-stage class S modulator efficiently amplifies a wideband envelope and allows the EER-type amplifier to efficiently amplify a wideband RF signal having a correspondingly wideband modulation bandwidth.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments. For example, power amplifier 260 could be comprised of multiple stages.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A method of amplifying an input signal, said method comprising the steps of:

creating a pulsewidth modulated signal as a function of said input signal;

amplifying said pulsewidth modulated signal in a plurality of saturating amplifiers to create a plurality of amplified pulsewidth modulated signals;

providing a transient current to each of said plurality of saturating amplifiers from a charge storage device; and combining said plurality of amplified pulsewidth modulated signals to produce a composite signal.

2. The method of claim 1 further comprising the step of filtering said composite signal.

3. A method of amplifying an input signal, said method comprising the steps of:

splitting said input signal into an envelope component and a phase component;

responsive to said envelope component, creating a pulsewidth modulated signal;

amplifying said pulsewidth modulated signal using a plurality of saturating amplifiers to create a plurality of amplified pulsewidth modulated signals;

providing a transient current from a charge storage device to said plurality of saturating amplifiers;

combining said plurality of amplified pulsewidth modulated signals to produce an amplified envelope signal;

amplifying said phase component with an amplifier stage; and modulating said amplifier stage with said amplified envelope signal.

4. An apparatus comprising:

a pulsewidth modulator coupled to an input of said apparatus, said pulsewidth modulator having an output;

a plurality of switching stages, each of said plurality of switching stages having an input coupled to the output of said pulsewidth modulator, and an output; and a summing point coupled to the output of each of the plurality of switching stages.

5. The apparatus of claim 4 wherein:

each switching stage includes a high side switch, a low side switch, and a capacitor;

the high side switch is coupled between a voltage supply and the output of the switching stage such that when the high side switch is closed, the output of the switching stage is electrically coupled to the voltage supply;

the low side switch is coupled between a reference and the output of the switching stage such that when the low side switch is closed, the output of the switching ad stage is electrically coupled to the reference; and the capacitor is coupled between the voltage supply and the reference.

6. The apparatus of claim 5 wherein said apparatus is implemented on a monolithic semiconductor substrate.

7. The apparatus of claim 5 further comprising a low pass filter coupled between said summing point and an output of said apparatus.

8. The apparatus of claim 5 wherein said high side switch and said low side switch are transistors.

9. The apparatus of claim 4 wherein each of said plurality of switching stages includes:

means for switching the output of the switching stage between a voltage supply value and a reference value; and means for storing a charge that will supply a transient current when the output of the switching stage is switched to the voltage supply value.

10. The apparatus of claim 9 wherein said apparatus is implemented on a monolithic semiconductor substrate.

11. The apparatus of claim 9 wherein said means for switching comprises a high side switching element and a low side switching element interconnected such that the high side switching element is coupled between a voltage supply and said output of the switching stage, and the low side switching element is coupled between a reference and said output of the switching stage.

12. The apparatus of claim 11 wherein said means for storing a charge comprises a capacitor coupled between said voltage supply and said reference.

13. The apparatus of claim 12 wherein said high side switching element and said low side switching element are transistors.

14. The apparatus of claim 13 wherein said apparatus is implemented on a monolithic semiconductor substrate.

15. An apparatus for amplifying an input signal, said apparatus comprising:

a power amplifier stage for amplifying said input signal, said power amplifier stage having a modulating input;

an envelope detector for detecting an envelope of said input signal; and a multi-stage modulator for amplifying said envelope of said input signal, said multi-stage modulator having an output which drives said modulating input of said power amplifier stage.

16. The apparatus of claim 15 wherein said multistage modulator comprises:

a pulsewidth modulator coupled to an input of said multi-stage modulator, said pulsewidth modulator having an output;

a plurality of switching stages, each of said plurality of switching stages having an input coupled to the output of said pulsewidth modulator, and an output; and a summing point coupled to the output of each of the plurality of switching stages.

17. The apparatus of claim 15 wherein:

each switching stage includes a high side switch, a low side switch, and a capacitor;

the high side switch is coupled between a voltage supply and the output of the switching stage such that when the high side switch is closed, the output of the switching stage is electrically coupled to the voltage supply;

the low side switch is coupled between a reference and the output of the switching stage such that when the low side switch is closed, the output of the switching stage is electrically coupled to the reference; and the capacitor is coupled between the voltage supply and the reference.

18. A communications device including an amplifier wherein said amplifier comprises:

a pulsewidth modulator coupled to an input of said amplifier, said pulsewidth modulator having an output;

a plurality of switching stages, each of said plurality of switching stages having an input coupled to the output of said pulsewidth modulator, and an output; and a summing point coupled to the output of each of the plurality of switching stages.

19. The communications device of claim 18 wherein:

each switching stage includes a high side switch, a low side switch, and a capacitor;

the high side switch is coupled between a voltage supply and the output of the switching stage such that when the high side switch is closed, the output of the switching stage is electrically coupled to the voltage supply;

the low side switch is coupled between a reference and the output of the switching stage such that when the low side switch is closed, the output of the switching in stage is electrically coupled to the reference; and the capacitor is coupled between the voltage supply and the reference.

20. The communications device of claim 19 wherein said amplifier is implemented on a monolithic semiconductor substrate.

* * * * *

UNITED STATES PATENT AND TRADEMARK OFFICE
CERTIFICATE OF CORRECTION

PATENT NO. : 5,990,735
DATED : November 23, 1999
INVENTOR(S) : Bernard E. Sigmon and Ronald G. Myers It is certified that error appears in the above-identified patent and that said Letters Patent is hereby corrected as shown below:

Column 8, line 10, after "switching", delete "ad".

Column 10, line 12, after "switching", delete "in".

Signed and Sealed this

Twentieth Day of March, 2001

Attest:

NICHOLAS P. GODICI

Attesting Officer     Acting Director of the United States Patent and Trademark Office